United States Patent [19]
Kanebako

[11] Patent Number: 5,094,971
[45] Date of Patent: Mar. 10, 1992

[54] METHOD OF MANUFACTURING A READ ONLY SEMICONDUCTOR MEMORY DEVICE

[75] Inventor: Kazunori Kanebako, Yokohama, Japan

[73] Assignee: Kabushiki Kaisha Toshiba, Kawasaki, Japan

[21] Appl. No.: 684,938
[22] PCT Filed: Sep. 4, 1990
[86] PCT No.: PCT/JP90/01126
  § 371 Date: May 1, 1991
  § 102(e) Date: May 1, 1991
[87] PCT Pub. No.: WO91/03837
  PCT Pub. Date: Mar. 21, 1991

[30] Foreign Application Priority Data

Sep. 4, 1989 [JP] Japan .................. 1-227477

[51] Int. Cl.⁵ ............................... H01L 21/70
[52] U.S. Cl. ........................ 437/52; 437/27; 437/45; 437/48; 357/23.12
[58] Field of Search ......... 437/26, 27, 28, 45, 437/48, 52, 228, 233, 235; 357/23.12, 45

[56] References Cited

U.S. PATENT DOCUMENTS

| | | | |
|---|---|---|---|
| 4,052,229 | 10/1977 | Pashley | 437/45 |
| 4,506,436 | 3/1985 | Balceman, Jr. et al. | 437/26 |
| 4,608,748 | 9/1986 | Noguchi et al. | 437/52 |
| 4,818,716 | 4/1989 | Okuyama et al. | 437/45 |
| 4,898,840 | 2/1990 | Okuyama et al. | 437/48 |
| 4,904,615 | 2/1990 | Okuyama et al. | 437/45 |
| 5,002,896 | 3/1991 | Naruke | 437/48 |

FOREIGN PATENT DOCUMENTS

| | | |
|---|---|---|
| 0148448 | 9/1983 | Japan . |
| 0154259 | 9/1983 | Japan . |
| 63-104469 | 5/1988 | Japan . |
| 63-215063 | 9/1988 | Japan . |
| 1-11358 | 1/1989 | Japan . |
| 1-37867 | 2/1989 | Japan . |
| 109763 | 4/1989 | Japan . |
| 1-128565 | 5/1989 | Japan . |

Primary Examiner—Brian E. Hearn
Assistant Examiner—Tom Thomas
Attorney, Agent, or Firm—Foley & Lardner

[57] ABSTRACT

This invention relates to a method of manufacturing a read only semiconductor memory device such as a NAND type ROM, etc. In this device, a plurality of memory cells are connected in series. These memory cells are such that first memory cells each having a first gate electrode made up at a process step and second memory cells each having a second gate electrode made up at a different process step are arranged one after another. According to whether or not an impurity of a second conductivity type is introduced into the surface portion of a first conductivity type impurity layer just under the first and second gate electrodes, respective memory cells store one logical value of binary data.

10 Claims, 7 Drawing Sheets

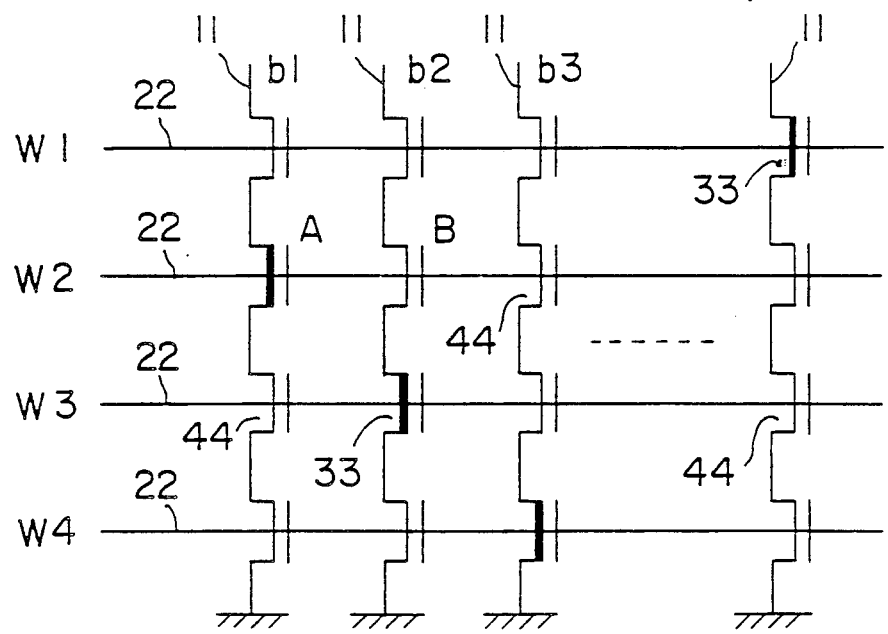
F I G. 1
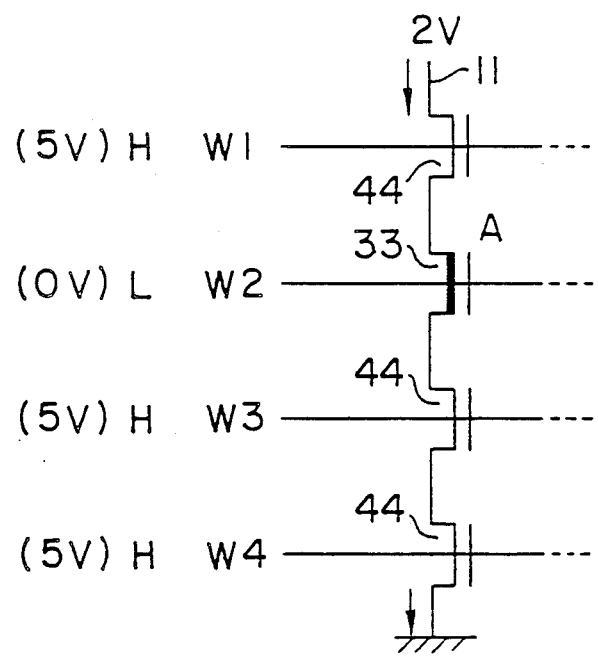
F I G. 2

METHOD OF MANUFACTURING A READ ONLY SEMICONDUCTOR MEMORY DEVICE

FIELD OF THE INVENTION

This invention relates to a method of manufacturing a read only semiconductor memory device, and more particularly to a method of manufacturing a semiconductor memory device such as a NAND type mask ROM of the two layer layer electrode structure suitable for miniaturization.

BACKGROUND OF THE INVENTION

In order to allow the read only memory (ROM) to be of a large scale structure, it is most suitable to adopt a cell structure of the NAND type in which the cell size is reduced by connecting in series transistors functioning as a memory cell. The principle of the operation of such a cell is schematically shown in FIGS. 1 and 2.

FIG. 1 shows the cell system of the NAND type mask ROM, and FIG. 2 shows a readout of this ROM. In these figures, reference numerals 11 denote bit lines, 22 word lines, 33 depletion type transistors, and 44 enhancement type transistors, respectively. In the case of reading data in the cell A in these figures, gates $W_1$, $W_3$ and $W_4$ are caused to have a high voltage (e.g., 5 V), and the gate $W_2$ is caused to have zero volts. In addition, the drain (bit line $b_1$) is stepped up. At this time, if a current flows, the cell A is considered to be comprised of a depletion type transistor, and, on the other hand, if no current flows, the cell A is considered to be comprised of an enhancement type transistor. In this mask ROM, discrimination between "0" and "1" of data is made in dependency upon whether the transistor is of the depletion type or the enhancement type. In order to allow the transistor to be of depletion type, impurities of a conductivity type opposite to that of the substrate are ion-implanted into the portion below the electrode of the substrate. This ion implantation will be called ROM implantation hereinafter.

To miniaturize such a NAND type cell, it is sufficient to allow the pitches between transistors connected in series to be as small as possible. To reduce such pitches, two-layer polysilicon was conventionally employed as the gate electrode.

The process of the conventional example for preparing a device of such a structure is shown in FIGS. 3A to 3C.

As seen from FIG. 3A, e.g., a p-type silicon substrate or a p-type well within an n-type substrate may be used as the substrate 1. A gate oxide film 2 is formed on the substrate 1. Thereafter, a resist 3 is coated or covered over the region except for a region where a transistor desired to be of depletion type is to be formed. By using the resist 3 as a mask, impurity 4 of a conductivity type opposite to that of the substrate, e.g. phosphorus is ion-implanted into the region where an impurity layers 4A are to be formed, e.g., under the condition of an acceleration voltage of 40 KeV, and a dose quantity of $3 \times 10^{13}$ cm$^{-2}$ (ROM implantation).

As seen from FIG. 3B, a polysilicon layer 5A is then formed so that its thickness is equal to about 4000 Å. This layer 5A is processed by the reactive ion etching (RIE) to form first gate electrodes 5.

Thereafter, as seen from FIG. 3C, an inter-gate-electrode insulating film 6 is formed by thermal oxidation at a temperature of 900° C. Then, a polysilicon layer 7A having a thickness of 4000 Å is formed. This layer 7A is processed by RIE to form second gate electrodes 7. At the time of forming the second gate electrodes 7, RIE processing is carried out so that the end portions of the second gate electrodes 7 overlap with the upper parts of the first gate electrodes 5.

Let now consider how the lower limit of the space S1 between first electrodes 5 is determined by the conventional process described above.

In FIG. 4, S1 represents a space between first electrodes 5, S2 a ROM implantation mask space, $L_{min}$ a line minimum value of the ROM implantation mask, $Leff_{min}$ a transistor minimum effective channel length, $\Delta x$ an expansion of impurities implanted by the ROM implantation, and $\Delta M$ an alignment margin. In FIG. 4, the respective values are assumed as follows.

The processing limit of lithography is assumed to be 0.7 μm/0.7 μm (line $L_{min}$/space $S_{min}$).

The alignment margin $\Delta M$ of lithography is assumed to be 0.25 μm in the case of direct alignment.

The expansion $\Delta x$ in a lateral direction of ROM implanted impurities is assumed to be 0.15 μm.

The minimum effective channel length ($Leff_{min}$) of the transistor comprised of the second gate electrode 7 is assumed to be 0.4 μm.

In the ROM implantation and formation of the first gate electrodes 5, positioning of lithography is carried out indirectly, e.g., through a field oxide film. For this reason, the alignment shift margin $\Delta M$ is equal to $\sqrt{2} \times 0.25 \div 0.35$ μm.

In the case where ROM implantation is carried out into the portion below the space between the first gate electrodes 5 arranged in a row, the space S1 between first gate electrodes 5 is represented by the following relationship with respect to the lower limit of the minimum effective channel of the transistor constituted with second gate electrode 7 therebetween:

The width of the space between first gate electrodes $5 \geq Leff_{min} + 2\Delta x + 2\Delta M \div 1.4$ (μm) = S1.

Further, the above-mentioned space width is represented by the following relationship also with respect to the minimum value $L_{min}$ of the line width of the implantation mask for carrying out the ROM implantation:

The width of the space between first gate electrodes $5 \leq L_{min} + 2\Delta M \div 1.4$ (μm) = S1.

From either point of view, S1 is nearly equal to 1.4 μm. Thus, it is seen that the space width between first gate electrodes 5 is twice as large than the limit $S_{min} = 0.7$ (μm) in processing of the space between first gate electrodes 5, and therefore the alignment shift margin of the ROM implantation gives a great obstacle to miniaturization of cell.

In this prior art, calculation similar to the above is carried out in the case of carrying out ROM implantation into the portion below the space between the second gate electrodes adjacent to each other. For this reason, the lower limit of the line width of the first gate electrode becomes equal to a value of 1.4 μm or more.

Thus, the size in a direction where transistors are connected in series per cell becomes equal to $(1.4 + 1.4)/2 = 1.4$ μm.

A conventional process partially improved in connection with the alignment shift is shown in FIGS. 5A to 5D.

As seen from FIG. 5A, in order to form an impurity regions 4A below the regions where first gate electrodes 5 are to be formed, a first ROM implantation of the impurity 4 is initially carried out by using resist 3 as a mask.

As seen from FIG. 5B, first gate electrodes 5 are then formed.

As seen from FIG. 5C, an inter-gate-electrode insulating film 6 is then formed. Thereafter, in order to form impurity regions 9A below the regions where second gate electrodes 7 are to be formed by using resist 8 as a mask, a second ROM implantation of an impurity 9 is executed. As the impurity 9 of a conductivity type opposite to that of the substrate 1 at this time, phosphorus $^{31}p^+$ is implanted into, e.g., a p-type substrate under the condition of a dose quantity of the order of $10^{13}$ cm$^{-2}$ at 40 KeV. The ion 9 range at this time is smaller than 4000 Å of the first gate electrode thickness. For this reason, ions 9 do not come into the portions below the first gate electrodes 5. Thus, impurities are implanted into the channel portions below the second gate electrodes 7 by self-alignment. Accordingly, the restriction expressed as the first gate electrode line width $\geq 1.4$ μm as in the prior art of FIGS. 3A to 3C is eliminated. However, the restriction of the width of the space S1 between first gate electrodes 5 is not eliminated, so this width becomes equal to a value of 1.4 (μm) or more.

In implementing miniaturization to a semiconductor memory, such as, for example, a NAND type mask ROM of two-layer electrodes 5, 7 structure in a manner stated above, the alignment shift margin of ion-implanted impurities constitutes a great obstacle as described above.

SUMMARY OF THE INVENTION

An object of this invention is to provide a method of manufacturing a semiconductor memory device such as a NAND type read only memory, etc. which can be miniaturized to a greater degree by allowing the self-alignment ion implantation below the first electrode to be carried out by the first gate.

This invention is a method of manufacturing a read only semiconductor memory device, wherein the read only semiconductor memory device includes a plurality of memory cells connected in series, these memory cells being such that first memory cells each having a first gate electrode made up at a process step and second memory cells each having a second gate electrode made up at a process step different from the above process step, are arranged one after another, the memory cells being adapted to respectively store one logical value of binary data according to whether or not an impurity of a second conductivity type is introduced into the surface portion of a first conductivity type impurity layer just under the first and second gate electrodes, the method comprising the steps of:

(a) forming an insulating film on the surface of the impurity layer, (b) introducing an impurity of the first conductivity type in order to form cancellation impurity layers having a peak at a portion deep from the surface of the impurity layer by more than the thickness of each of the first gate electrodes, (c) forming the first gate electrodes on the insulating film, said first gate electrodes facing each other separated by regions each having a predetermined width where second gate electrodes are to be formed, respectively, (d) forming an insulating film on the first gate electrodes, (e) covering a first mask layer over at least one of the first gate electrodes and regions where the second gate electrodes are to be formed, (f) introducing an impurity of the second conductivity type at an energy sufficient to penetrate each of the first gates electrode by using the first mask layer as a mask to thereby introduce the impurity into the surface portions of the impurity layer just under the first gate electrodes which are not covered with the first mask, and to introduce the impurity into the cancellation impurity layers below the respective regions where the second gate electrodes are to be formed, the respective region being not covered with the first mask, (g) covering a second mask layer over at least one of the first gate electrode and regions where the second gate electrodes are to be formed, (h) introducing an impurity of the second conductivity type at an energy to such an extent so as not to penetrate each of the first gate electrodes by using the second mask layer as a mask to thereby introduce the impurity of the second conductivity type into the surface portion of the impurity layer below the regions which are not covered with the second mask layer of the respective regions where the second gate electrodes are to be formed between the first gate electrodes, and (i) forming the second gate electrodes on the respective regions where the second gate electrodes are to be formed.

Thus, ion implantation into the portions below both the first and second gate electrodes are also carried out by the first and second gate electrodes and self-alignment. For this reason, it becomes unnecessary to take into consideration the influence of the alignment margin and/or alignment shift in the ion implantation. Thus, the size of the cell can be considerably reduced.

BRIEF DESCRIPTION OF THE DRAWINGS

FIG. 1 is a diagram showing the configuration of the cell system of a NAND type ROM of a conventional structure, FIG. 2 is an explanatory view of readout of the NAND type ROM of the conventional structure.

EMBODIMENT

An embodiment of this invention is shown in FIGS. 6A to 6E. As seen from FIG. 6A, a gate oxide film 2 is formed in the atmosphere of dry oxygen at 900° C. on a substrate 1, e.g., a p-type silicon substrate or a p-type well, etc. within an n-type substrate. Then, an impurity (e.g., boron having a concentration of $5 \times 10^{13}$ cm$^{-2}$) 1A of the same conductivity type as that of the substrate 1 is ion-implanted at an energy having a range where the thickness of polysilicon 5A which will be described later is 4000 Å or more (e.g., 180 KeV). Thus, an ion implanted layer 1B will be formed later.

Figure 3A:
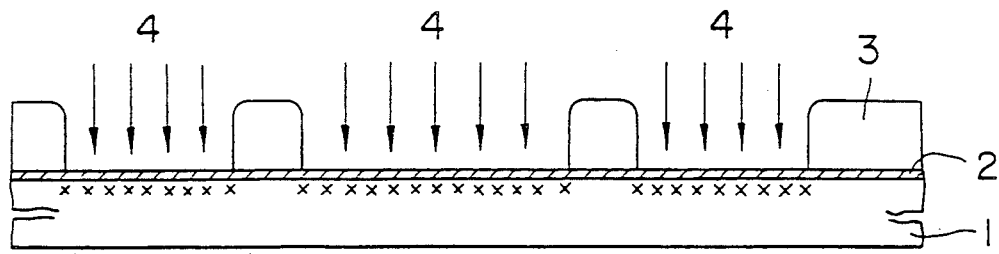
FIGS. 3A to 3C are cross sectional views showing manufacturing process steps of a conventional semiconductor device, respectively.
Figure 3B:
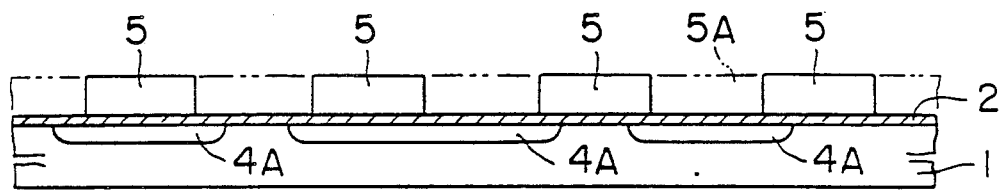
Figure 3C:
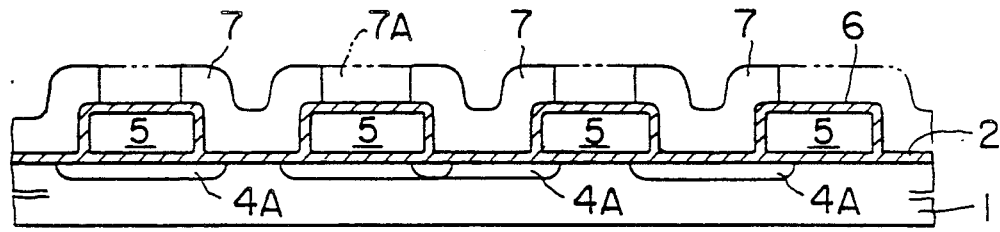
Figure 4:
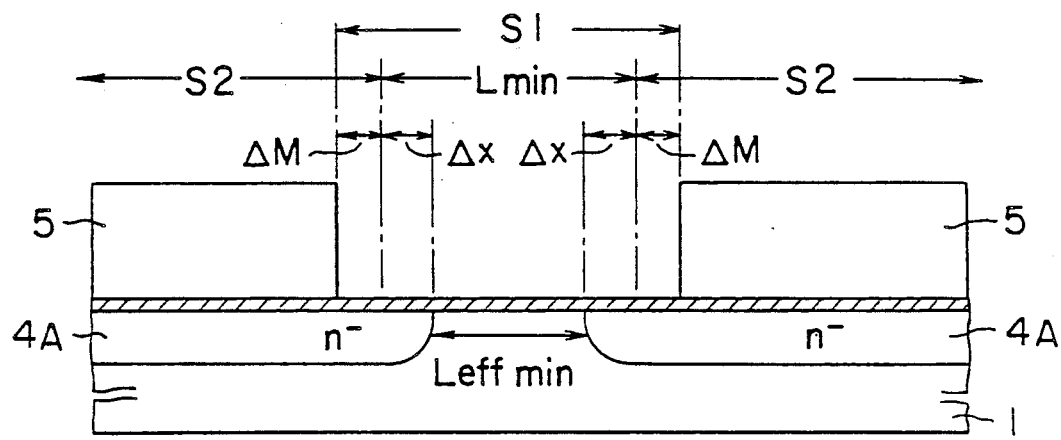
FIG. 4 is an explanatory view for determining the lower limit of a first gate electrode space of the above-mentioned conventional device.
Figure 5A:
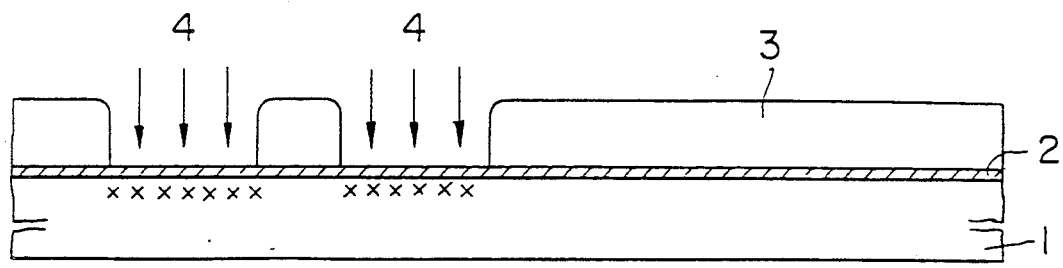
FIGS. 5A to 5D are cross sectional views showing manufacturing process steps of another conventional device, respectively.
Figure 5B:
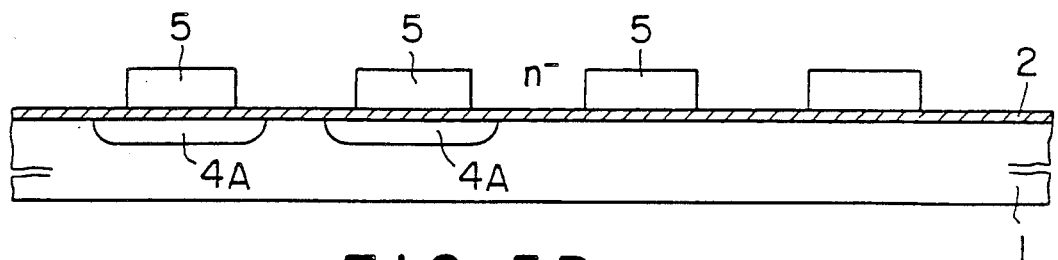
Figure 5C:
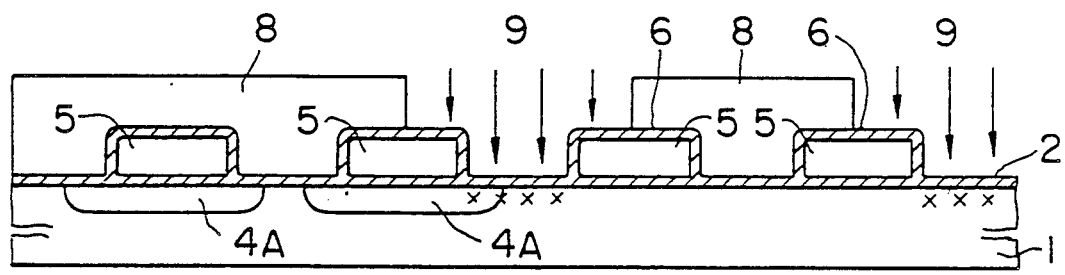
Figure 5D:
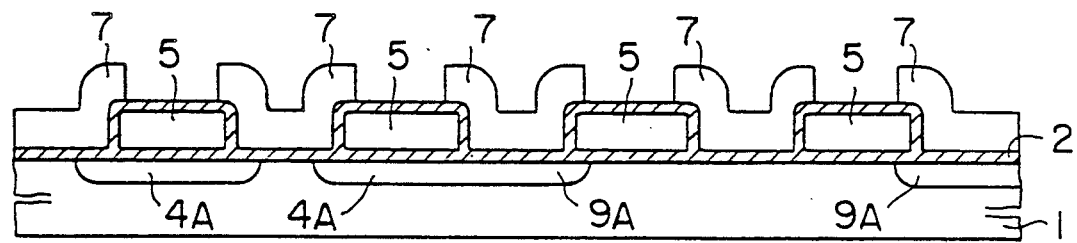
Figure 6A:
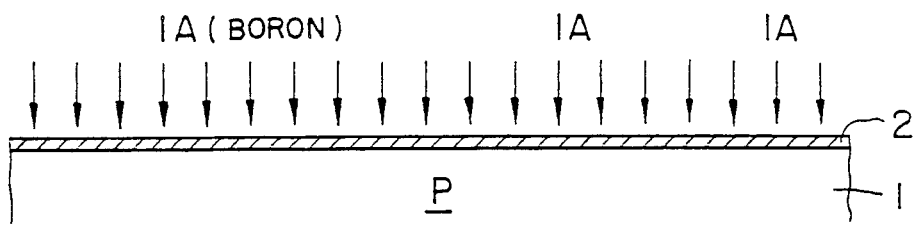
FIGS. 6A to 6E are cross sectional views showing manufacturing process steps of a semiconductor device of an embodiment according to this invention, respectively.
Figure 6B:
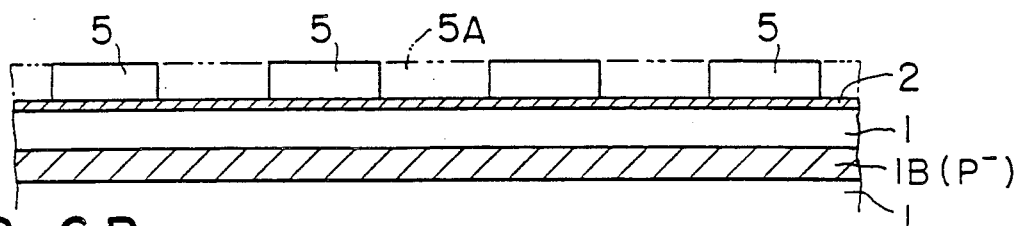

Thereafter, as seen from FIG. 6B, first polysilicon 5A is formed at about 630° C. by LPCVD method so that its thickness is equal to 4000 Å. Phosphorus impurity for lowering resistivity is introduced into the polysilicon 5A. Then, the polysilicon 5A is processed by reactive ion etching (RIE) using the resist pattern as a mask to thereby form first gate electrodes 5.

Figure 6C:
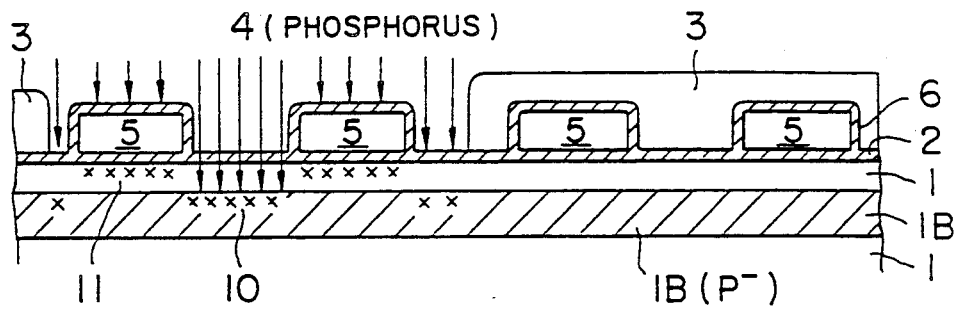

Then, as seen from FIG. 6C, an inter-gate-electrode insulating film 6 is formed. Thereafter, as the first ROM implantation, an impurity (e.g., phosphorus having a concentration of $3 \times 10^{13}$ cm$^{-2}$)4 of a conductivity type opposite to that of the substrate 1 is implanted by using the resist 3 as a mask. The acceleration energy of phosphorus at this time must fall within a range larger than about 4000 Å of the first polysilicon 5A thickness, and is therefore, e.g., 340 KeV. This may be accomplished by implanting $^{31}$p$^+$ at 340 KeV, or by implanting $^{31}$p$^{++}$ at 170 KeV. Thus, impurities 10 and 11 are implanted into the ion implantation layer 1A and the substrate. The impurity (phosphorus) 10 comes deeply into the substrate 1, i.e., comes into the portion having a depth larger than the thickness of the first polysilicon 5A. Thus, the above-mentioned impurity is cancelled by the impurity (boron) in the ion implantation layer 1B formed in FIG. 6A. At this time, since the impurity 10 is deeply implanted into the substrate 1, this impurity hardly exerts the influence on the threshold value of the transistor formed by the second gate electrode 7.

Figure 6D:
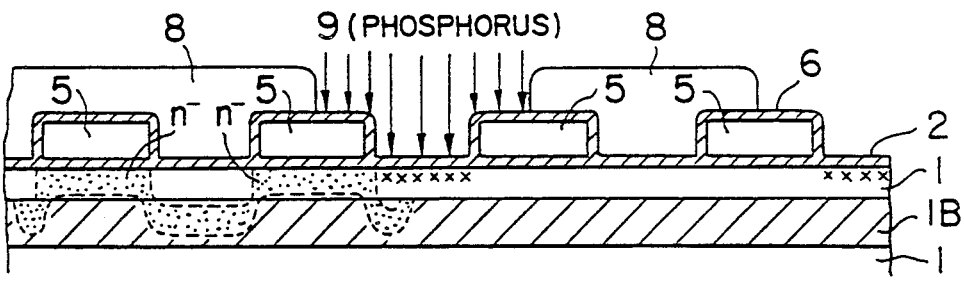

As seen from FIG. 6D, in the same manner as in other prior arts, by using the resist 8 and the first gate electrodes 5 as a mask, an impurity (phosphorus) 9 may be then implanted into the portion below the space between first gate electrodes 5 by self-alignment as a second ROM ion implantation.

Figure 6E:
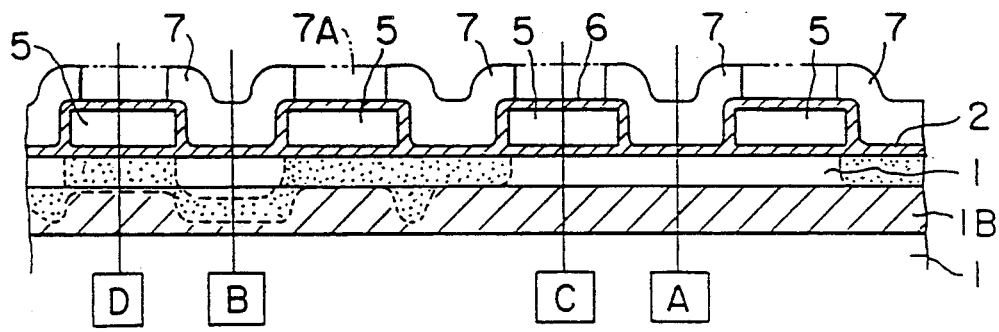

Thereafter, as seen from FIG. 6E, second gate electrodes 7 are formed from the second polysilicon 7A.

FIGS. 7A to 7D show distributions in a depth direction of the impurity taken along the [A] to [D] cross sections of FIG. 6E, respectively. It is seen from FIG. 7B that the impurity (phosphorus) implanted at a deep portion below the space between first gate electrodes 5 is cancelled by boron in the ion implantation layer 1B.

Figure 7A:
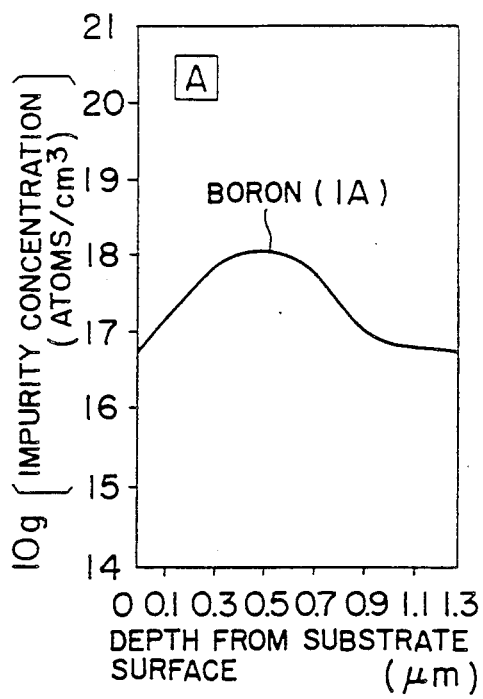
FIGS. 7A to 7D are diagrams showing impurity profiles in a depth direction of the semiconductor substrate taken along the $\boxed{A}$ to $\boxed{D}$ cross sections of FIG. 6E.
Figure 7B:
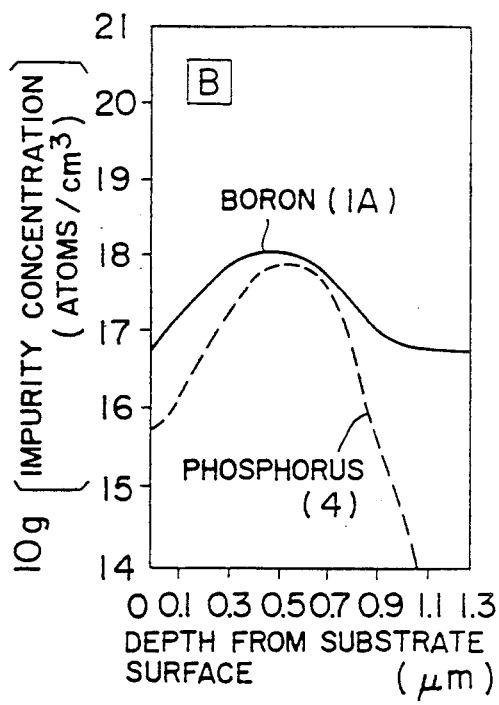
Figure 7C:
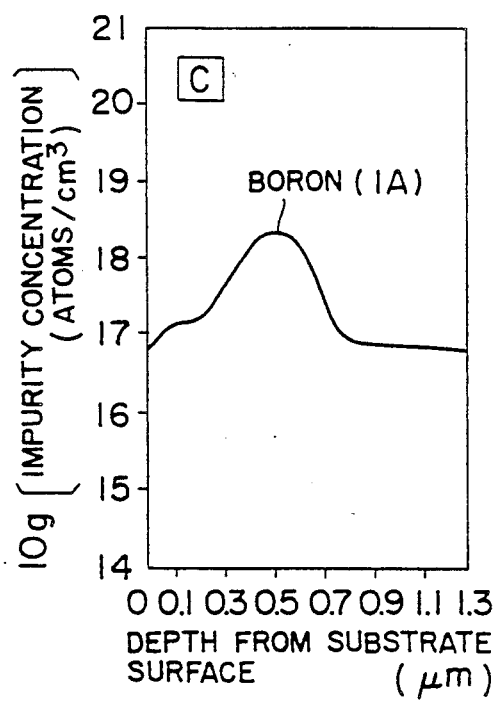
Figure 7D:
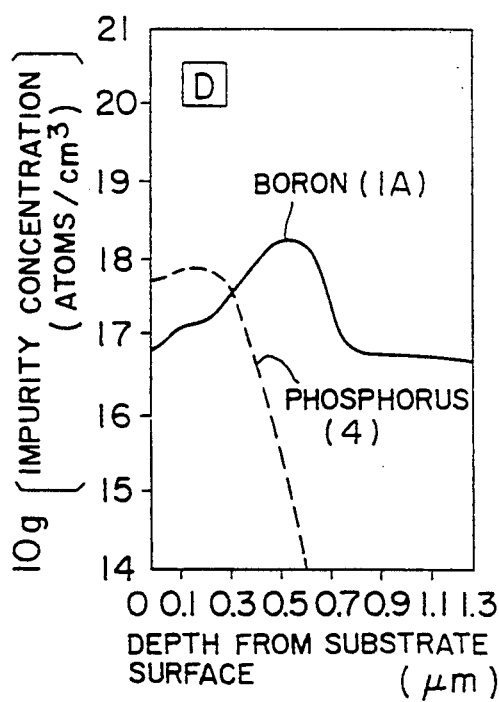

Further, it is also seen from FIG. 7B that phosphorus has a concentration lower than that of boron at all times, and that the threshold value is unchanged irrespective of whether or not phosphorus is present.

Figure 8:
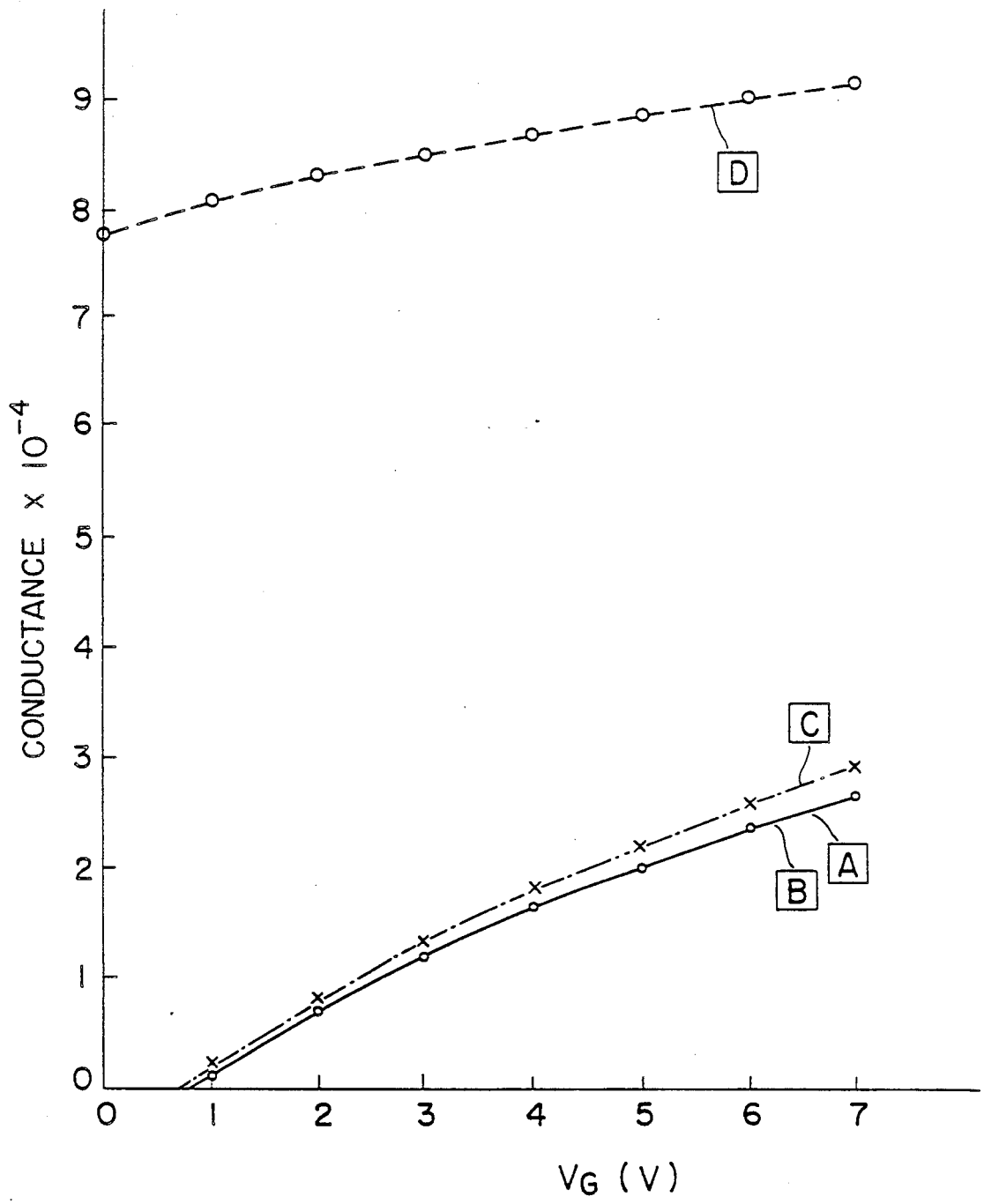
FIG. 8 is a characteristic diagram showing $V_G$ with respect to conductance of respective MOS structures taken along the $\boxed{A}$ to $\boxed{D}$ cross sections in the above-mentioned embodiment this invention.

The experimental result of the relationship between the gate voltage (V$_G$) and the conductance of the MOS transistors at portions of [A] to [D] FIG. 6E is shown in FIG. 8. In accordance with this experimental result, it is seen that the deep phosphorus 10 implanted into the space portion between first gate electrodes 5 hardly exerts the influence on the threshold values of the transistors comprised of the second gate electrodes 7 and the characteristic showing the gate voltage with respect to the conductance. In the figure, the characteristics at the portions [A], [B] and [C] are slightly different from each other. However, in order to allow the threshold values or cell currents of the transistors each comprised of the gate electrode 5 and the transistors each comprised of the second gate electrode 7 to be in correspondence with each other, it is sufficient to carry out, at the process step of FIG. 6D, ion implantation onto the entire surface of the cell portion at an energy of a range less than the thickness of the first polysilicon 5A.

This invention includes a process step for ion-implanting the impurity 4 at an acceleration voltage of a range slightly larger than the thickness of the first gate electrode 5. The reason why this process step is included is that an acceleration voltage sufficient to penetrate the first electrode 5 is required because ion implantation is carried out through the first gate electrode 5. However, since the first gate electrode 5 is put between the gate oxide film 2 and the inter-gate-electrode insulating film 6, it is required, as a matter of course, to apply an acceleration voltage sufficient to penetrate these films. However, the thickness of the gate electrode 5 in the embodiment is equal to about 4000 Å, whereas the thicknesses of the oxide film and the insulating film, etc. are equal to about 200 to 280 Å, respectively. For this reason, the influence as the result of the fact that the both film thicknesses are neglected is not so great.

Figure 9:
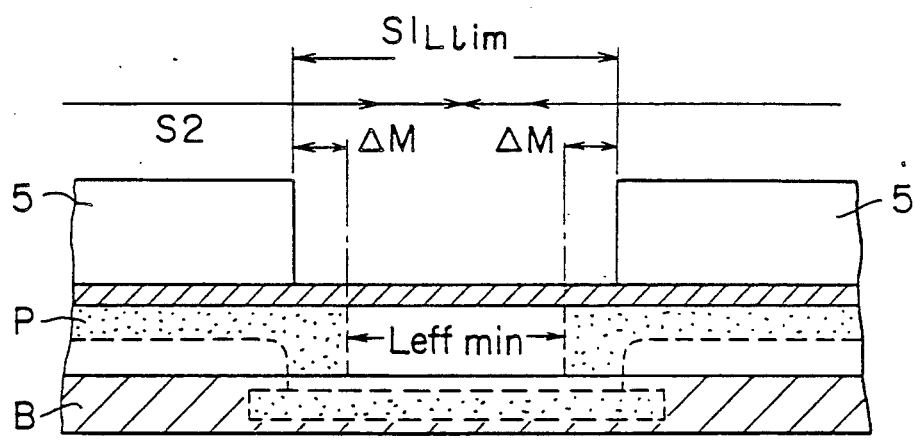
FIG. 9 is an explanatory view for determination of the lower limit of the first gate electrode space of this invention.

In the process of the embodiment as described above, the lower limit of the space between first gate electrodes 5 can be determined as shown in FIG. 9. The assumption of the processing level and/or the alignment are the same as in the case of the prior art. From FIG. 9, the relationships are given as follows:

The space S1 between first gate electrodes ≧
The space lower limit S1 $L_{1,m}$ of the first gate
electrode processing = 0.7 μm The space S1 between first gate electrocdes S1 ≧
$Leff_{min} + \Delta M \approx 0.7$ (μm)

In this embodiment, in the case of implanting phosphorus into the portion below adjacent first gate electrodes 5 as the first ROM implantation 4, there is no need to allow ROM data not to be put between first gate electrodes 5. For this reason, there is no restriction resulting from the lower limit of the line processing of the ROM implantation mask as in the prior art.

Further, in this embodiment, ion-implantation for ROM data is carried out after oxidation of the intergate-electrode insulating film. For this reason, the influence of the thermal process on the ROM implantation or other impurity profiles can be reduced. Thus, in this embodiment, ΔM becomes equal to a value smaller than the value of the prior art.

Furthermore, in this embodiment, ion-implantation is carried out deeply into the substrate at the process step of FIG. 6A to thereby form a peak of the impurity of the same conductivity type as that of the substrate. However, such a peak is not necessarily required to be prepared at this process step, but may be formed at the time of formation of p-well.

In addition, in this embodiment, the ion implantation for ROM data is carried out after formation of the insulating film between gate electrodes of the main thermal process. For this reason, there results small changes in the impurity profile. It can be said that this also contributes to miniaturization.

It is to be noted that while polysilicon is used as the first and second gate electrodes in the above-described embodiment, the electrode material to be used is not limited to polysilicon. For example, a high melting-point silicide such as tungsten silicide, polycide utilizing polysilicon, or the like may be used.

In addition, in dependency upon the condition of the thermal processing and/or the acceleration voltage, a phenomenon such that the threshold value of the memory cell below the second gate electrode 7 is slightly lowered by introduction of phosphorus 10 implanted beforehand may be observed. To prevent this, before or after implantation of phosphorus 4 shown in FIG. 6C, the same mask pattern as that for the implantation of phosphorus 4 is used to implant boron into the portion in the vicinity of the surface of the substrate 1. Namely, e.g., at an energy of 20 to 30 KeV and a dose quantity of $2 \times 10^{11}$ to $2 \times 10^{12}/cm^2$, boron ions are implanted. Thus, boron ions are introduced into the portion immediately below the second gate electrode on the substrate 1, so the above-mentioned threshold value lowering phenomenon can be avoided.

I claim:

1. A method of manufacturing a read only semiconductor memory device including a plurality of memory cells connected in series, these memory cells being such that first memory cells each having a first gate electrode made up at a process step and second memory cells each having a second gate electrode made up at a process step different from the above process step are arranged one after another, said memory cells being adapted to respectively store one logical value of binary data according to whether or not an impurity of a second conductivity type is introduced into the surface portion of a first conductivity type impurity layer just under said first and second gate electrodes, said method comprising the steps of:

(a) forming an insulating film on the surface of said impurity layer, (b) introducing an impurity of said first conductivity type in order to form cancellation impurity layers having a peak at a portion deep from the surface of said impurity layer by more than the thickness of each of said first gate electrodes, (c) forming the first gate electrodes on the insulating film, said first gate electrodes facing each other separated by regions each having a predetermined width where said second gate electrodes are to be formed, respectively, (d) forming an insulating film on said first gate electrodes, (e) covering a first mask layer over at least one of said first gate electrodes and regions where the second gate electrodes are to be formed, (f) introducing an impurity of said second conductivity type at an energy sufficient to penetrate each of said first gates electrodes by using said first mask layer as a mask to thereby introduce said impurity into the surface portions of said impurity layer just under said first gate electrodes which are not covered with said first mask, and to introduce said impurity into said cancellation impurity layers below said respective region where said second gate electrodes are to be formed, said respective region being not covered with said first mask, (g) covering a second mask layer over at least one of said first gate electrode and regions where said second gate electrodes are to be formed, (h) introducing an impurity of said second conductivity type at an energy to such an extent so as not to penetrate each of said first gate electrodes by using said second mask layer as a mask to thereby introduce said impurity of said second conductivity type into the surface portion of said impurity layer below the regions which are not covered with said second mask layer of said respective regions where said second gate electrodes are to be formed between said first gate electrodes, and (i) forming said second gate electrodes on the respective regions where said second gate electrodes are to be formed.

2. A manufacturing method as set forth in claim 1, which further comprises a step of introducing an impurity of said second conductivity type at an energy to such an extend so as not to penetrate each of said first gate electrodes by using said first mask layer as a mask to thereby introduce said second conductivity type impurity into the surface portion of said impurity layer just below said respective regions where said second gate electrodes are to be formed, said respective regions being not covered with said first mask.

3. A manufacturing method as set forth in claim 1, wherein said process steps of (e) and (f) are carried out prior to said process steps of (g) and (h).

4. A manufacturing method as set forth in claim 1, wherein said process steps of (e) and (f) are carried out after said process steps of (g) and (h).

5. A manufacturing method as set forth in claim 1, wherein said impurity layer is a p-type impurity layer, said impurity of said first conductivity type introduced at said process step (b) being boron, said impurity of said second conductivity type introduced at said process steps (f) and (h) being phosphorus.

6. A manufacturing method as set forth in claim 1, wherein said impurity layer is a p-well formed within an n-type semiconductor substrate.

7. A manufacturing method as set forth in claim 6, wherein introduction of said impurity of said process step (b) is carried out at the time of forming said p-well.

8. A manufacturing method as set forth in claim 1, wherein said first and second gate electrodes are made up by polysilicon.

9. A manufacturing method as set forth in claim 1, wherein said first and second gate electrodes are comprised one of high melting point silicide such as tungsten silicide, etc. and polycide including polysilicon.

10. A manufacturing method as set forth in claim 1, wherein said read only semiconductor memory device is a NAND type ROM.

* * * * *